US006784722B2

(12) United States Patent
Tang et al.

(10) Patent No.: US 6,784,722 B2
(45) Date of Patent: Aug. 31, 2004

(54) WIDE-RANGE LOCAL BIAS GENERATOR FOR BODY BIAS GRID

(75) Inventors: Stephen H. Tang, Beaverton, OR (US); Dinesh Somasekhar, Hillsboro, OR (US); James W. Tschanz, Portland, OR (US); Vivek K. De, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/267,951

(22) Filed: Oct. 9, 2002

(65) Prior Publication Data

US 2004/0070440 A1 Apr. 15, 2004

(51) Int. Cl.[7] ................................................. G35F 1/10
(52) U.S. Cl. ...................................... 327/534; 327/543
(58) Field of Search ................................ 327/534, 537, 327/540, 543; 365/226, 227, 228, 229

(56) References Cited

U.S. PATENT DOCUMENTS

| 3,969,682 | A | * | 7/1976 | Rossum ........................ 330/85 |
| 5,192,884 | A | * | 3/1993 | Kusano ....................... 327/552 |
| 5,378,947 | A | * | 1/1995 | Matsui ........................ 327/552 |
| 5,815,446 | A | * | 9/1998 | Tobita .................... 365/189.09 |
| 6,037,808 | A | * | 3/2000 | Houston et al. ............... 327/55 |
| 6,166,577 | A | * | 12/2000 | Mizuno et al. .............. 327/278 |
| 6,341,087 | B1 | * | 1/2002 | Kunikiyo ................ 365/189.09 |
| 6,400,225 | B1 | * | 6/2002 | Kruiskamp .................. 330/253 |
| 6,466,077 | B1 | * | 10/2002 | Miyazaki et al. ............ 327/534 |
| 2001/0017812 | A1 | * | 8/2001 | Morishita .................... 365/226 |
| 2003/0021161 | A1 | * | 1/2003 | Fifield et al. ........... 365/189.09 |

OTHER PUBLICATIONS

Sackinger, E. et al., "A Versatile Building Block: The CMOS Differential Difference Amplifier", IEEE Journal of Solid–State Circuits, vol. SC–22, No. 2, Apr. 1987, 0018–9200.

Kuroda, T. et al., "Variable Threshold–Voltage CMOS Technology", IEICE Trans. Electron., vol. E83–C, No. 11, Nov. 2002, pp. 1705–1715.

Miyazaki, M. et al., "A 175mV Multiply–Accumulate Unit using an Adaptive Supply Voltage and Body Bias (ASB) Architecture", ISSCC 200/Session 3/Digital Signal Processors and Circuits/ 3.4., IEEE International Solid–State Circuits Conference, 0–7803–7335–9, ©2000 11pgs.

Narendra, S. et al., "1.1V 1GHz Communications Router with On–Chip Body Bias in 150nm CMOS", ISSCC 2002/Session 16/High Speed I/O/16.4. IEEE International Solid–State Circuits Conference, 0–7803–7335–9, ©2002, 10pgs.

Tschanz, J. et al., "Adaptive Body Bias for Reducing Impacts of Die–to–Die and Within–Die Parameter Variations on Microprocessor Frequency and Leakage", ISSCC 2002/Session 25/Processor Building Blocks/25.7, IEEE International Solid–State Circuits Conference, 0–7803–7335–9, ©2002, 10pgs.

* cited by examiner

Primary Examiner—Terry D. Cunningham
(74) Attorney, Agent, or Firm—Buckley, Maschoff and Talwalker LLC

(57) ABSTRACT

A circuit is provided having a differential difference amplifier (DDA) having first and second inputs to receive a desired body bias signal, and a third input to receive a supply voltage, the DDA configured to generate an intermediate output signal, the intermediate output signal coupled to an output buffer generating an output signal having a desired gain, the DDA having a fourth input, to cause the output signal to reference to variations in the supply voltage.

13 Claims, 6 Drawing Sheets

WIDE-RANGE LOCAL BIAS GENERATOR FOR BODY BIAS GRID

BACKGROUND

A circuit may be used to apply a body bias to one or more transistors in an integrated circuit. Through application of a body bias, performance of a transistor may be improved and/or power consumption may be reduced. In particular, a body bias circuit may be used to set the threshold voltage ($V_{th}$) of one or more transistors in an integrated circuit by using the body effect of the transistors.

Body bias circuits generally provide either a fixed forward bias or a zero bias of transistors in integrated circuits. Generally, body bias circuits provide body bias voltages to relatively small areas of integrated circuits. Many integrated circuits have local supply voltage variations. Body bias circuits generally are unable to respond to local supply voltage variations while providing a wide range of body bias voltages, including forward, reverse and zero body biases.

DETAILED DESCRIPTION

Figure 1:
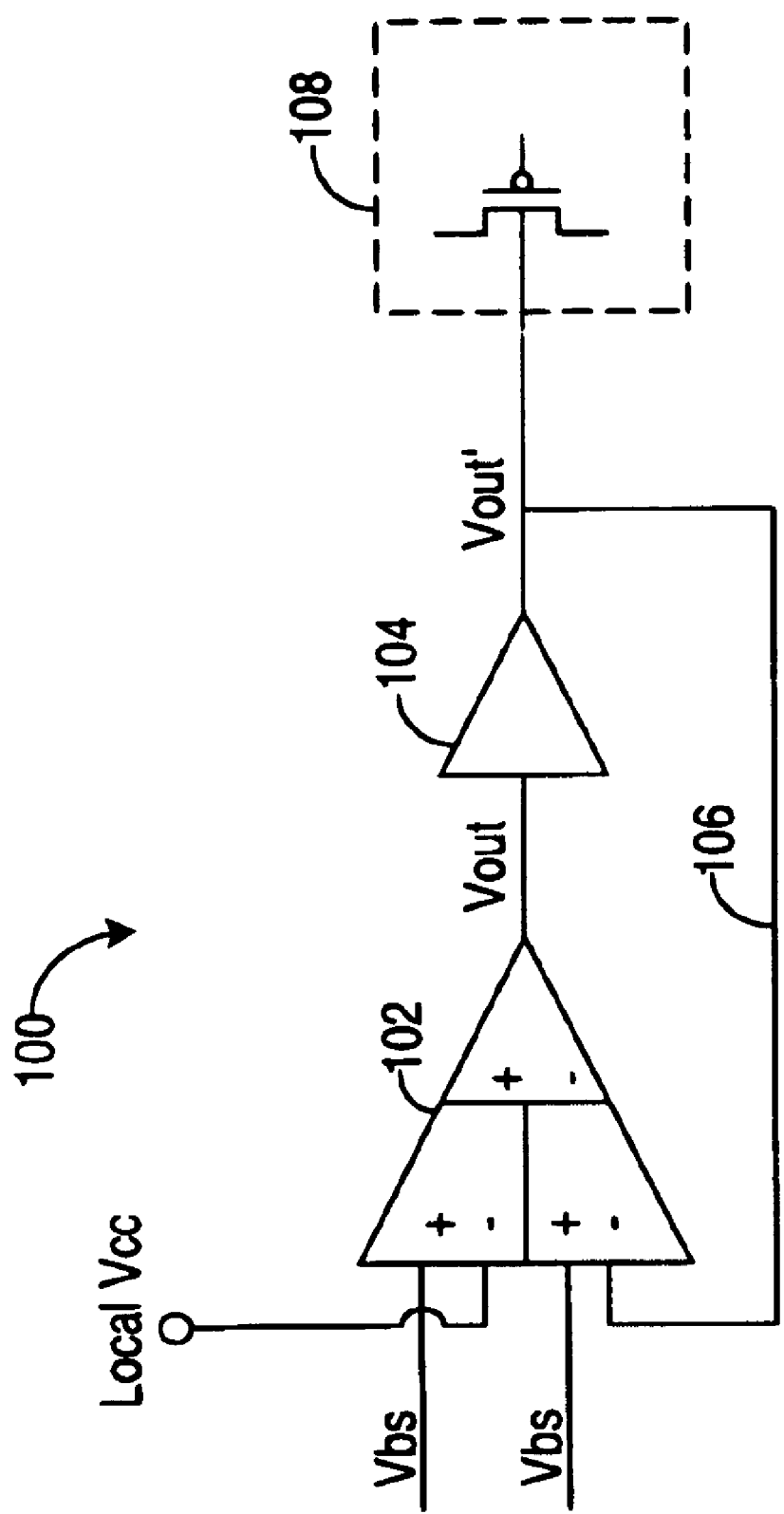
FIG. 1 is a block diagram of a circuit according to some embodiments.

Some embodiments are associated with circuits that generate a body bias voltage for application to one or more transistors. Details of features of embodiments will be described by first referring to FIG. 1 where a body bias circuit 100 is depicted. Body bias circuit 100 includes a differential difference amplifier (DDA) 102 configured to receive a bias voltage ($V_{bs}$), a local supply voltage ($V_{cc}$) and a feedback signal 106 from the output ($V_{out}'$) of a buffer 104. Buffer 104 receives an output signal ($V_{out}$) from DDA 102. The signal ($V_{out}'$) output from buffer 104 is a body bias voltage that is distributed to one or more transistors 108. For example, in some embodiments $V_{out}'$ is distributed to a plurality of transistors of an integrated circuit. For clarity and ease of exposition, the transistor 108 of the circuit of FIG. 1 will be referred to in the singular; however, embodiments distribute Vout' to a plurality of transistors as will be described further below in conjunction with FIGS. 3 and 4.

Bias voltage ($V_{bs}$) is a differential signal (e.g., representing a difference between a body and a source voltage). The signal may be fixed or it may be variable. In some embodiments, body bias circuit 100 may be configured to supply a negative, or reverse body bias voltage to transistor 108. In this manner, $V_{th}$ of transistor 108 may be raised to reduce leakage power of the transistor. In some embodiments, $V_{th}$ of a number of transistors in an integrated circuit are adjusted to reduce the overall leakage power of the circuit.

In some embodiments, body bias circuit 100 may be configured to supply a positive, or forward body bias. In this manner, $V_{th}$ of transistor 108 may be lowered to increase operating speed. In some embodiments, $V_{th}$ of a number of transistors in an integrated circuit are adjusted to increase an overall operating speed of the integrated circuit. In some embodiments, a number of body bias circuits 100 are provided throughout an integrated circuit and the local supply voltage ($V_{cc}$) applied to each body bias circuit 100 is the supply voltage available at different portions of the integrated circuit.

Figure 2:
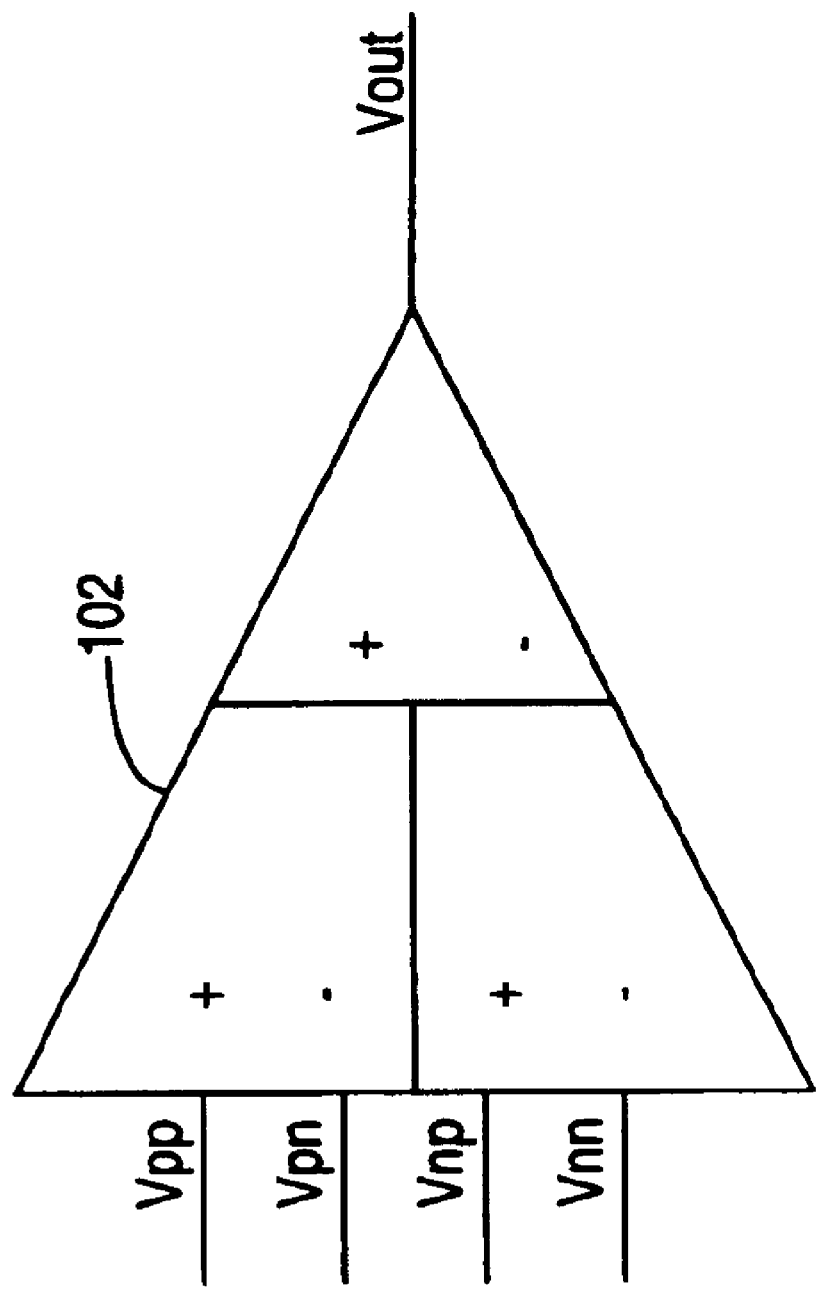
FIG. 2 is a block diagram of a differential difference amplifier which may be utilized in the circuit of FIG. 1 in some embodiments.

DDA 102 is a device that is configured to track local variations in the supply voltage. Referring now to FIG. 2, a representation of DDA 102 is shown which will be used to describe a functional relationship between the output signal (Vout) and the four input signals. In general, embodiments utilize a DDA or similar circuitry that provides the following functional relationship between the output signal ($V_{out}$), a gain (k) of the DDA, and the four input signals:

$$V_{out} = k*[(V_{pp}-V_{pn})-(V_{np}-V_{nn})]$$

Assuming high gain, with feedback, DDA 104 generally operates to ensure that $V_{pp}-V_{pn}=V_{np}-V_{nn}$, or $V_{pp}-V_{np}=V_{pn}-V_{nn}$. Therefore, if the desired body bias $V_{bs}$ is applied across $V_{pp}$ and $V_{np}$ and the local supply rail is monitored at $V_{pn}$, with feedback, $V_{nn}$ will be forced to be the desired body bias, referenced to the local supply voltage. Those skilled in the art will recognize that any suitable circuit configured to provide the above-identified functional relationship between the output and the inputs may be used. Applicants have found that differential difference amplifiers configured as depicted in the attached figures provide desirable results. Further details of one suitable differential difference amplifier are described in E. Sackinger and W. Guggenbuhl, "A Versatile Building Block: The CMOS Differential Difference Amplifier," IEEE Journal of Solid-State Circuits, Vol. 22, No. 2, April 1987, pp. 287–294. Other devices configured to provide the above-described functional relationship between the inputs and $V_{out}$ may also be used.

Referring again to FIG. 1, in the embodiment depicted, the body bias voltage signal $V_{out}'$ is configured to apply a body bias voltage to one or more p-channel transistors by applying the local supply voltage ($V_{cc}$) to a negative input line of DDA 102 (referenced as input line $V_{pn}$ of FIG. 2). Those skilled in the art will recognize, upon reading this disclosure, that body bias circuit 100 may be configured to deliver a body bias voltage to n-channel transistors as well (e.g., by applying a local ground signal, or $V_{ss}$, to a negative input line of DDA 102, or input line $V_{pn}$ of FIG. 2).

DDA 102, in some embodiments, provides relatively low current drive. Buffer 104 is selected to provide an output gain sufficient to drive one or more transistors 108. In some embodiments, for example, where few transistors are coupled to an output of body bias circuit 100, there may be no need for buffer 104 (i.e., DDA 102 may provide sufficient output drive to deliver a body bias voltage to each of the transistors). In some embodiments, e.g., where a number of transistors will receive the body bias voltage provided by body bias circuit 100, buffer 104 is utilized to provide sufficient gain to supply the body bias voltage to each of the transistors. In addition, embodiments utilize buffer 104 to provide a desired total gain which reduces fluctuations or errors in the generated body bias voltage.

As a particular example, where body bias circuit 100 is utilized in a large-scale integrated circuit having a local $V_{cc}$ of approximately 1.1 V, and where the desired body bias voltage is approximately 0.3 V, a total gain of body bias circuit 100 is selected to be approximately 100 (e.g., where a gain of DDA 102 is approximately 10 and a gain of buffer 104 is selected to also be approximately 10). In such a configuration, the body bias voltage produced at the output ($V_{out}'$) of buffer 104 is provided with sufficient gain to drive a number of transistors. Further, a total gain of approximately 100 provides a relatively stable output with low error (e.g., with variations in the bias voltage of no more than approximately 10 mV). Use of an output buffer having a higher gain will provide greater current drive and lower variations in the bias voltage.

Figure 5:
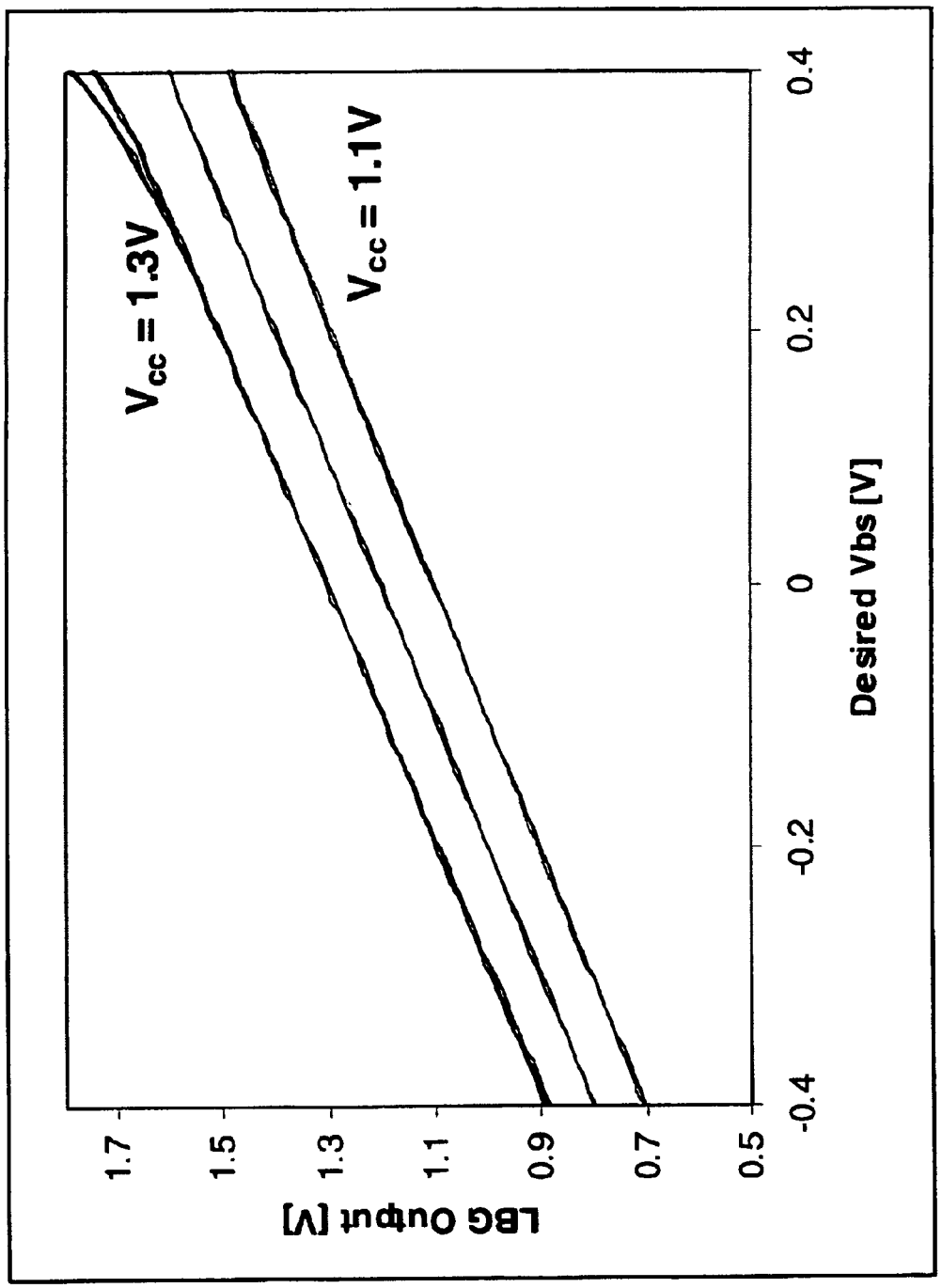
FIG. 5 illustrates a relationship between a desired bias voltage for various supply voltages in the circuit of FIG. 1.

An example graphical depiction of simulation results for a particular device is shown in FIG. 5. FIG. 5 depicts simulation results for a particular device having particular design characteristics which are provided for illustrative purposes only. As shown, $V_{out}'$ (labled on FIG. 5 as "LBG Output [V]") is compared to a desired $V_{bs}$ for various local supply voltages. As depicted in FIG. 5, the top curve is for a local supply voltage ($V_{cc}$) of 1.3V, the middle curve is for a $V_{cc}$ of 1.2V, and the lower curve is for a $V_{cc}$ of 1.1 V. As shown, $V_{out}'$ is generally equal to the desired $V_{bs}$ referenced to the local supply voltage.

Figure 3:
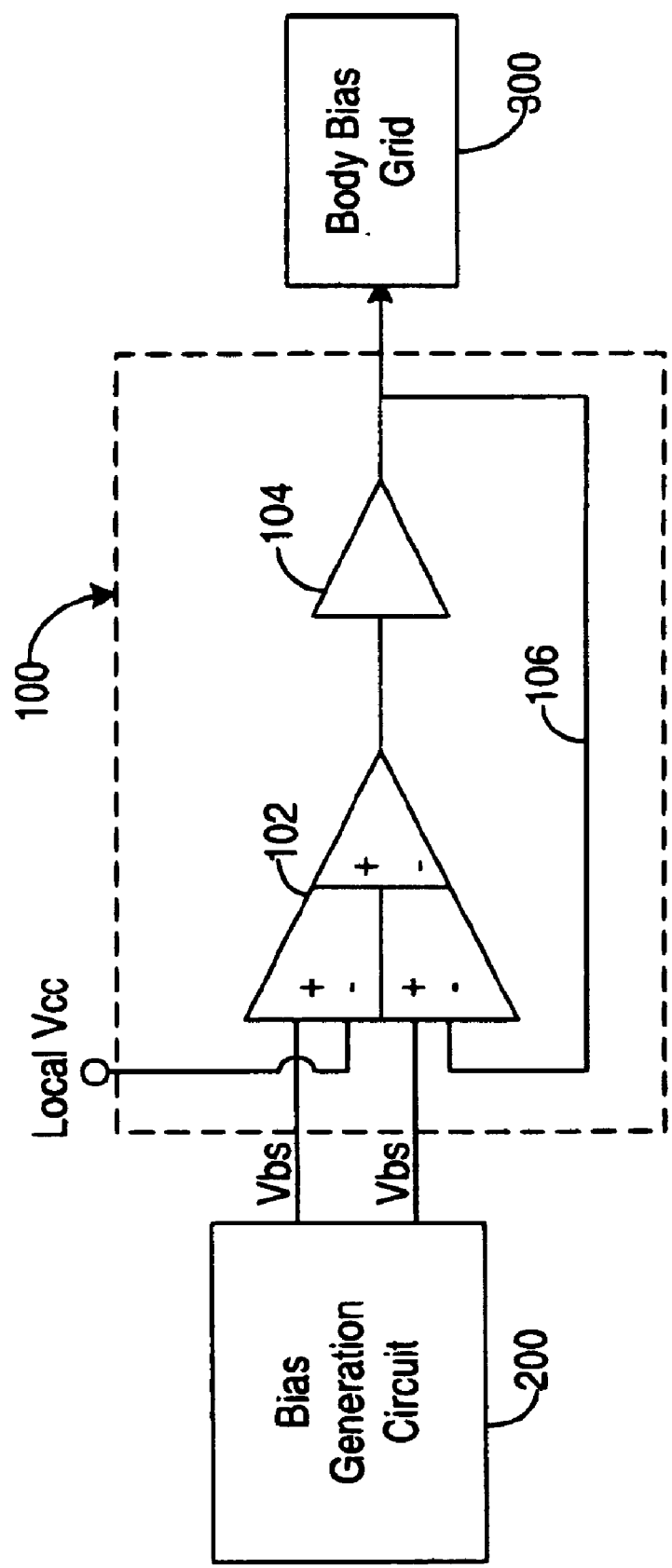
FIG. 3 is a block diagram of a further circuit according to some embodiments.

Embodiments allow the application of a desired body bias to a number of transistors in a large-scale integrated circuit. In many large-scale integrated circuits, transistor sources are typically tied to local supply rails. These local supply rails can suffer from noise due to fluctuating current demands. This can result in local variations in supply voltage. Embodiments allow the application of a desired body bias, which tracks local variations in supply voltage. Reference is now made to FIG. 3, where an embodiment is depicted which applies a desired body bias voltage to a body bias grid 300. Body bias grid 300 is used to deliver a desired body bias voltage to a number of transistors coupled to the grid. In this manner, a desired body bias which tracks local variations in supply voltage can be applied to large numbers of transistors in an integrated circuit.

In the depicted embodiment, a bias generation circuit 200 is used to set a desired body bias voltage ($V_{bs}$). This body bias voltage is delivered to one or more body bias circuits (100) (which also may be referred to as "local bias generators" or "LBGs") distributed throughout the integrated circuit. Each body bias circuit 100 is tied to a local supply rail (identified in FIG. 3 as the "local $V_{cc}$") to track local variations in supply voltage. In the embodiment depicted, body bias circuit 100 is configured to provide a body bias voltage to a number of p-channel transistors (e.g., because the local $V_{cc}$ is tied to a negative input of DDA 102). A similar body bias circuit 100 may be configured to provide a body bias voltage to a number of n-channel transistors. Body bias circuit 100 is configured to receive a desired body bias voltage ($V_{bs}$) from bias generation circuit 200 and also receives a feedback signal 106 from an output of a buffer 104. A body bias signal, referenced to the local $V_{cc}$, is output from buffer 104 and supplied to a body bias grid 300. Transistors to be biased are coupled to receive the body bias signal distributed by body bias grid 300.

Bias generation circuit 200 may be configured to variably select a desired body bias voltage ($V_{bs}$). Embodiments allow the selective application of different body biases, including reverse or forward body biases of different magnitudes. Further, bias generation circuit 200 may be configured to select a zero body bias voltage as well. In this manner, operation characteristics of an integrated circuit may be tuned as desired. Bias generation circuit 200 may be a circuit such as, for example, a scaled bandgap circuit or other circuit configured to provide a desired $V_{bs}$ to one or more body bias circuits 100.

In this manner, embodiments allow the application of a desired body bias to change the threshold voltage ($V_{th}$) of a large number of transistors in a large-scale integrated circuit. Further, embodiments allow the consistent application of a desired body bias despite the existence of noise or other fluctuations in local supply voltage (e.g., due to fluctuating current demands across portions of a large-scale integrated circuit). Embodiments track local variations in supply voltage and maintain a desired body bias voltage using a network of local bias generators (LBGs) distributed throughout a large-scale integrated circuit. Each LBG may be coupled to a body bias grid to distribute a desired body bias voltage to a number of transistors coupled to the grid.

Figure 4:
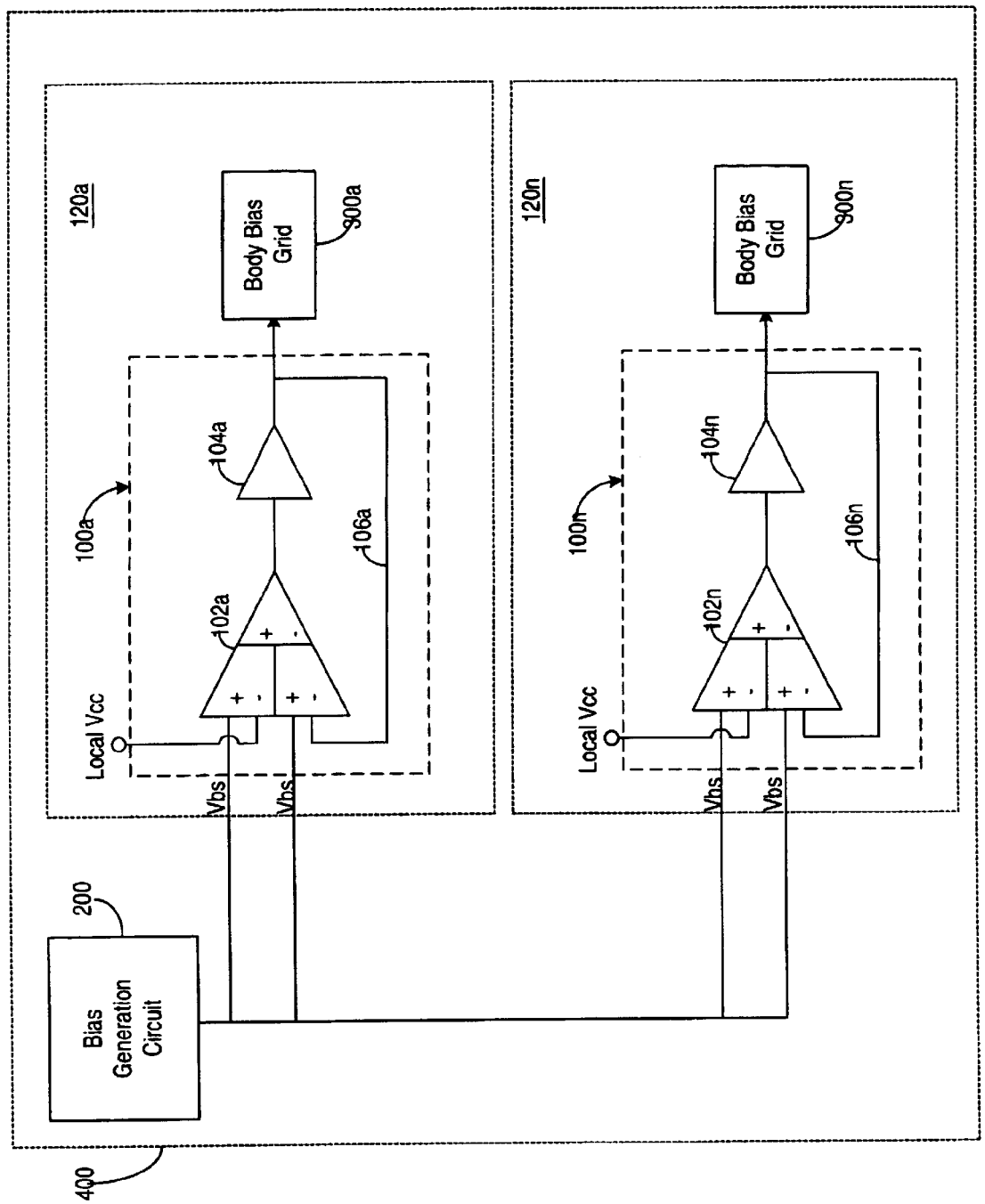
FIG. 4 is a block diagram of an integrated circuit utilizing features of some embodiments.

Further details of embodiments will now be described by reference to FIG. 4, where an integrated circuit 400 is depicted. Integrated circuit 400 may include digital and/or analog components including a number of transistors whose performance may be adjusted by application of a body bias voltage to the transistors. Integrated circuit 400 includes a number of regions 120a–n, each having a body bias circuit 100a–n and a body bias grid 300a–n. Each body bias grid 300 is coupled to a number of transistors (not shown) to receive a body bias voltage. The number of body bias circuits 100 utilized in integrated circuit 400 may be selected based on several considerations. For example, embodiments may provide a desired number of body bias circuts 100 based on the total capacitance of transistors in a particular area of integrated circuit 400. The number of body bias circuts 100 may be selected to balance considerations such as noise tolerance, device size, and circuit power requirements.

In general, the circuits of each region 120 are configured to reference a desired body bias voltage to a local supply voltage to maintain a desired body to source voltage for transistors in each region. Each body bias circuit 100 receives an input body bias signal ($V_{bs}$) from a bias generation circuit 200. Each body bias circuit 100 includes a local supply input tied to a local supply rail associated with the region 120 in which body bias circuit 100 is located. In this manner, a desired body bias voltage, referenced to the local supply voltage, can be delivered to a number of transistors in each region using body bias grid 300. Use of bias generation circuit 200 in conjunction with body bias circuits 100 allows application of an entire range of body biases which are tracked to local supply rails. In some embodiments, a single bias generation circuit 200 may be utilized to apply a variety of body bias voltages referenced to local supply voltages, thereby allowing the use of adaptive body bias schemes to reduce power consumed by integrated circuit 400 and/or to improve performance of integrated circuit 400. Further, performance variation of integrated circuits may also be reduced. Reduction of performance variation may provide increased die yield and other desirable manufacturing improvements.

Figure 6:
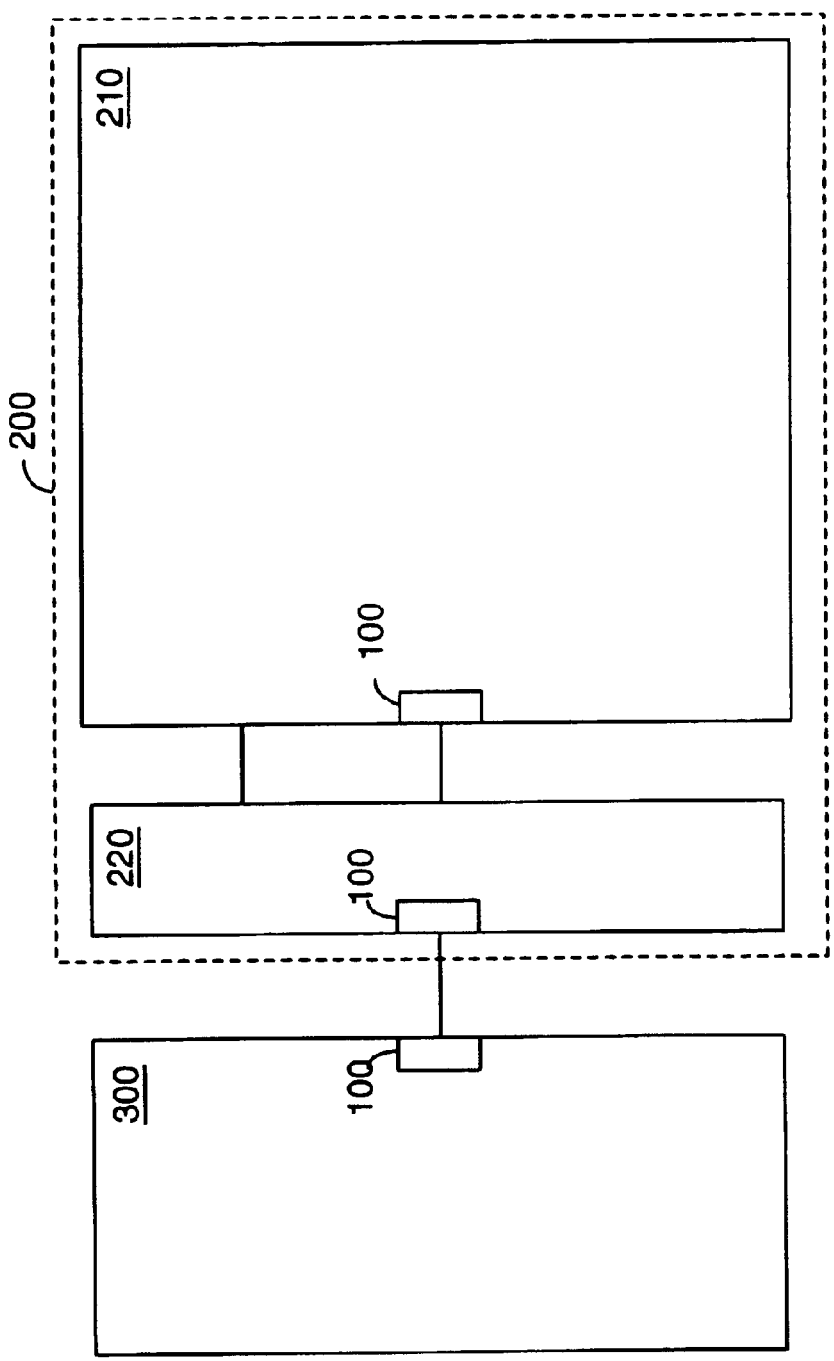
FIG. 6 is a block diagram of a system according to some embodiments.

FIG. 6 is a block diagram of a system according to some embodiments. Computer system 200 includes microprocessor 210, which includes an instance of body bias circuit 100 of FIG. 1. Computer system 200 also includes memory controller/chipset 220 coupled to one or more I/O pins of microprocessor 210 and to memory 300. As shown, memory controller 220 and memory 300 each include at least one instance of body bias circuit 100. Each of the illustrated instances of body bias circuit 100 is adapted to apply a body bias to one or more transistors (not shown). Embodiments may provide a computer system 200 in which body bias circuit 100 is provided in one or more components of the computer system.

Memory 300 may include any memory adapted to store data. Examples of such a memory include, but are not limited to, a hard drive, Dynamic Random Access Memory, Static Random Access Memory, Read-Only Memory, and Non-Volatile Random Access Memory. Moreover, microprocessor 210 may comprise any chip or processor including but not limited to a graphics processor, a digital signal processor, and a sound processor.

The several embodiments described herein are solely for the purpose of illustration. Persons skilled in the art will recognize from this description other embodiments may be practiced with modifications and alterations limited only by the claims.

What is claimed is:

1. An integrated circuit, comprising:
a bias generation circuit to set a desired body bias voltage;
a first plurality of transistors;
a first body bias grid coupled to the first plurality of transistors to provide a first body bias signal to the first plurality of transistors;
a first differential difference amplifier (DDA) having first and second inputs coupled to the bias generation circuit to receive the desired body bias voltage, and a third input to receive a first local supply voltage, the first DDA configured to generate a first intermediate output signal;
a first output buffer coupled to the first DDA to receive the first intermediate output signal, the first output buffer generating a first output signal having a desired gain, said first DDA having a fourth input coupled to receive said first output signal, to cause said first output signal to reference to variations in said first local supply voltage received at said third input, said first output signal coupled to said first body bias grid to provide said first body bias signal to the first plurality of transistors;
a second plurality of transistors;
a second body bias grid coupled to the second plurality of transistors to provide a second body bias signal to the second plurality of transistors;
a second DDA having first and second inputs coupled to the bias generation circuit to receive the desired body bias voltage, and a third input to receive a second local supply voltage, the second DDA configured to generate a second intermediate output signal; and
a second output buffer coupled to the second DDA to receive the second intermediate output signal, the second output buffer generating a second output signal having a desired gain, said second DDA having a fourth input coupled to receive said second output signal, to cause said second output signal to reference to variations in said second local supply voltage received at said third input of said second DDA, said second output signal coupled to said second body bias grid to provide said second body bias signal to the second plurality of transistors.

2. The integrated circuit of claim 1, wherein said body bias generation circuit is variably adjustable to provide a range of said desired body bias voltage.

3. The integrated circuit of claim 2, wherein said range includes negative and positive values.

4. The integrated circuit of claim 1, wherein said first plurality of transistors are at least one of a plurality of n-channel transistors and a plurality of p-channel transistors, and said second plurality of transistors are at least one of a plurality of n-channel transistors and a plurality of p-channel transistors.

5. An integrated circuit, comprising:
a bias generation circuit to set a desired body bias voltage;
a first plurality of transistors;
a first body bias grid coupled to the first plurality of transistors to provide a first body bias signal to the first plurality of transistors;
a first differential difference amplifier (DDA) generating a first intermediate output signal, said first DDA having inputs to receive the desired body bias voltage, a first local supply voltage, and a first output signal referenced to said first local supply voltage;
a first output buffer, to receive said first intermediate output signal and to generate said first output signal, said first output signal coupled to said first body bias grid to provide said first body bias signal to the first plurality of transistors;
a second plurality of transistors;
a second body bias grid coupled to the second plurality of transistors to provide a second body bias signal to the second plurality of transistors;
a second DDA generating a second intermediate output signal, said second DDA having inputs to receive the desired body voltage, a second local supply voltage, and a second output signal referenced to said second local supply voltage; and
a second output buffer, to receive said second intermediate output signal and to generate said second output signal, said second output signal coupled to said second body bias grid to provide said second body bias signal to the second plurality of transistors.

6. An integrated circuit, comprising:
a bias generation circuit to set a desired body bias voltage;
a first plurality of transistors;
a first body bias grid coupled to the first plurality of transistors to provide a first body bias signal to the first plurality of transistors;
a first body bias circuit including first and second inputs coupled to receive the desired body bias voltage and a third input coupled to receive a first local supply voltage, said first body bias circuit to output a first intermediate output signal;
a first output buffer, to receive said first intermediate output signal and to output a first output signal having a higher gain than said first intermediate output signal, said first output signal input to a fourth input of said first body bias circuit to reference said first output signal to said first local supply voltage, said first output signal further provided to said first body bias grid to provide said first body bias signal to said first plurality of transistors;
a second plurality of transistors;
a second body bias grid coupled to the second plurality of transistors to provide a second body bias signal to the second plurality of transistors;
a second body bias circuit including first and second inputs coupled to receive the desired body bias voltage and a third input coupled to receive a second local supply voltage, said second body bias circuit to output a second intermediate output signal; and
a second output buffer, to receive said second intermediate output signal and to output a second output signal having a higher gain than said second intermediate output signal, said second output signal input to a fourth input of said second body bias circuit to reference said second output signal to said second local supply voltage, said second output signal further provided to said second body bias grid to provide said second body bias signal to said second plurality of transistors.

7. The integrated circuit of claim 6, wherein said first body bias circuit comprises a first differential difference amplifier, and said second body bias circuit comprises a second differential difference amplifier.

8. An integrated circuit, comprising:
 a bias generation circuit selectively operable to generate a desired body bias voltage; and
 a first and a second circuit region, each region comprising
  a plurality of transistors;
  a local supply voltage,
  a body bias circuit having a first and second input to receive said desired body bias voltage, a third input coupled to said local supply voltage, and a fourth input coupled by a feedback path to an output of said body bias circuit to receive an output signal from said body bias circuit, so that said output signal is referenced to said local supply voltage, and
  a body bias grid coupled to provide said output signal to said plurality of transistors.

9. The integrated circuit of claim 8, wherein each region further comprises:
 an output buffer, coupled to increase a gain of said output signal.

10. The integrated circuit of claim 8, wherein said body bias circuit comprises a differential difference amplifier (DDA).

11. A method of operating an integrated circuit, comprising:
 selecting a desired body bias voltage;
 supplying said desired body bias voltage to a plurality of bias generation circuits distributed on said integrated circuit;
 generating, in each of said plurality of bias generation circuits, a local bias voltage referenced to a local supply voltage associated with each of said plurality of bias generation circuits; and
 distributing said local bias voltage to a plurality of transistors associated with each of said plurality of bias generation circuits.

12. The method of claim 11, wherein said desired body bias voltage is at least one of a reverse bias, a zero bias, and a forward bias.

13. A method according to claim 11, further comprising:
 feeding back the local bias voltage to an input of said each of said plurality of bias generation circuits to permit said local bias voltage to be referenced to said local supply voltage.

* * * * *